(12) United States Patent
Huang et al.

(10) Patent No.: US 10,536,169 B2
(45) Date of Patent: Jan. 14, 2020

(54) ENCODER AND DECODER FOR LDPC CODE

(71) Applicants: BEIHANG UNIVERSITY, Beijing (CN); BEIJING HANG TIAN HUA TECHNOLOGY CO., LTD., Beijing (CN); INSTITUTE OF SPACECRAFT SYSTEM ENGINEERING OF CHINA ACADEMY OF SPACE TECHNOLOGY, Beijing (CN)

(72) Inventors: Qin Huang, Beijing (CN); Chen Cai, Beijing (CN); Guolei Lu, Beijing (CN); Zulin Wang, Beijing (CN); Wenquan Feng, Beijing (CN); Shanbao He, Beijing (CN)

(73) Assignee: Tsinghua University, Beijing (CN)

( * ) Notice: Subject to any disclaimer, the term of this patent is extended or adjusted under 35 U.S.C. 154(b) by 99 days.

(21) Appl. No.: 15/529,620

(22) PCT Filed: Jan. 14, 2016

(86) PCT No.: PCT/CN2016/070865
§ 371 (c)(1),
(2) Date: Jul. 19, 2017

(87) PCT Pub. No.: WO2016/112857
PCT Pub. Date: Jul. 21, 2016

(65) Prior Publication Data
US 2017/0264314 A1  Sep. 14, 2017

(30) Foreign Application Priority Data

Jan. 14, 2015 (CN) .......................... 2015 1 0019132

(51) Int. Cl.
*H03M 13/00* (2006.01)
*H03M 13/11* (2006.01)

(52) U.S. Cl.
CPC ...... *H03M 13/1111* (2013.01); *H03M 13/116* (2013.01); *H03M 13/1137* (2013.01);
(Continued)

(58) Field of Classification Search
CPC .......... H03M 13/1111; H03M 13/1137; H03M 13/1188
See application file for complete search history.

(56) References Cited

U.S. PATENT DOCUMENTS

| 7,159,170 B2 * | 1/2007 | Shen .................. | G11B 20/1833 714/801 |
| 7,266,750 B1 * | 9/2007 | Patapoutian ....... | H03M 13/1105 714/758 |

(Continued)

FOREIGN PATENT DOCUMENTS

| CN | 101488760 | 7/2009 |
| CN | 102801432 | 11/2012 |
| CN | 103929189 | 7/2014 |

*Primary Examiner* — Esaw T Abraham
(74) *Attorney, Agent, or Firm* — HDC IP Law

(57) ABSTRACT

Disclosed relates to a decoder for LDPC code, including: a variable node processing unit; a check node processing unit; a memory for storing iterative messages of edges of a parity-check matrix for LDPC code; and a controller for controlling the node processing units to perform iterations of decoding until the decoding ends, wherein, in each iteration of decoding, the controller controls the variable node processing unit to compute variable node messages in a traversing manner for all variable nodes and updates the iterative messages in the memory according to the computed variable node messages, and controls the check node processing unit to compute check node messages in a traversing manner for all check nodes and updates the iterative messages in the memory according to the computed check node messages.

25 Claims, 10 Drawing Sheets

(52) U.S. Cl.
CPC ...... *H03M 13/1188* (2013.01); *H03M 13/611* (2013.01); *H03M 13/616* (2013.01); *H03M 13/6561* (2013.01)

(56) References Cited

U.S. PATENT DOCUMENTS

| | | | | |
|---|---|---|---|---|
| 8,291,279 | B2* | 10/2012 | Sharon | H03M 13/6505 |
| | | | | 714/752 |
| 8,335,949 | B2* | 12/2012 | Chugg | H03M 13/2975 |
| | | | | 714/704 |
| 8,359,522 | B2* | 1/2013 | Gunnam | H03M 13/1177 |
| | | | | 714/758 |
| 8,549,387 | B2* | 10/2013 | Lee | H03M 13/1111 |
| | | | | 714/752 |
| 8,707,144 | B2* | 4/2014 | Wang | H03M 13/1108 |
| | | | | 714/752 |
| 8,782,496 | B2* | 7/2014 | Sakaue | G06F 11/1048 |
| | | | | 714/773 |
| 9,026,880 | B2* | 5/2015 | Hayami | H03M 13/1117 |
| | | | | 341/107 |
| 9,184,767 | B2* | 11/2015 | Vernon | H03M 13/1108 |
| 9,503,125 | B2* | 11/2016 | Zhang | G06F 11/1012 |
| 9,739,004 | B2* | 8/2017 | Ha | G08C 17/02 |
| 10,153,781 | B2* | 12/2018 | Owen | H03M 13/1114 |

\* cited by examiner $$G = \begin{pmatrix} 1 & 0 & 0 & | & 0 & 0 & 0 & | & 1 & 0 & 0 \\ 0 & 0 & 0 & | & 1 & 0 & 0 & | & 0 & 0 & 0 \\ 0 & 1 & 0 & | & 0 & 0 & 0 & | & 0 & 1 & 0 \\ - & - & - & & - & - & - & & - & - & - \\ 0 & 0 & 1 & | & 0 & 0 & 0 & | & 0 & 0 & 1 \\ 0 & 0 & 0 & | & 1 & 0 & 0 & | & 1 & 0 & 0 \\ 0 & 0 & 0 & | & 0 & 1 & 0 & | & 0 & 0 & 0 \\ - & - & - & & - & - & - & & - & - & - \\ 0 & 0 & 0 & | & 0 & 1 & 0 & | & 0 & 1 & 0 \\ 0 & 0 & 0 & | & 0 & 0 & 1 & | & 0 & 0 & 0 \\ 1 & 0 & 0 & | & 0 & 0 & 0 & | & 0 & 0 & 1 \\ - & - & - & & - & - & - & & - & - & - \\ 0 & 0 & 0 & | & 0 & 0 & 1 & | & 0 & 0 & 0 \\ 0 & 1 & 0 & | & 0 & 0 & 0 & | & 0 & 0 & 0 \\ 0 & 0 & 1 & | & 0 & 0 & 0 & | & 0 & 0 & 0 \end{pmatrix}$$

$$G = \begin{pmatrix} 1 & 0 & 0 & | & 0 & 0 & 0 & | & 0 & 0 & 1 \\ 0 & 1 & 0 & | & 0 & 0 & 0 & | & 1 & 0 & 0 \\ 0 & 0 & 1 & | & 0 & 0 & 0 & | & 0 & 1 & 0 \\ - & - & - & & - & - & - & & - & - & - \\ 0 & 0 & 0 & | & 0 & 0 & 1 & | & 0 & 0 & 1 \\ 0 & 0 & 0 & | & 1 & 0 & 0 & | & 1 & 0 & 0 \\ 0 & 0 & 0 & | & 0 & 1 & 0 & | & 0 & 1 & 0 \\ - & - & - & & - & - & - & & - & - & - \\ 0 & 0 & 0 & | & 0 & 1 & 0 & | & 0 & 0 & 0 \\ 0 & 0 & 0 & | & 0 & 0 & 1 & | & 0 & 0 & 0 \\ 0 & 0 & 0 & | & 1 & 0 & 0 & | & 0 & 0 & 0 \\ - & - & - & & - & - & - & & - & - & - \\ 0 & 1 & 0 & | & 0 & 0 & 0 & | & 0 & 0 & 0 \\ 0 & 0 & 1 & | & 0 & 0 & 0 & | & 0 & 0 & 0 \\ 1 & 0 & 0 & | & 0 & 0 & 0 & | & 0 & 0 & 0 \end{pmatrix}$$

FIG. 7

$$H = \left( \begin{array}{ccc|ccc|ccc|ccc}
1 & 0 & 0 & 0 & 0 & 0 & 0 & 0 & 0 & 0 & 0 & 1 \\
0 & 1 & 0 & 0 & 0 & 0 & 0 & 0 & 1 & 1 & 0 & 0 \\
0 & 0 & 1 & 0 & 0 & 0 & 0 & 0 & 0 & 0 & 1 & 0 \\
\hline
0 & 0 & 0 & 0 & 0 & 0 & 1 & 0 & 0 & 0 & 0 & 1 \\
0 & 0 & 0 & 1 & 0 & 0 & 0 & 0 & 1 & 1 & 0 & 0 \\
0 & 0 & 0 & 0 & 1 & 0 & 0 & 0 & 0 & 0 & 1 & 0 \\
\hline
0 & 0 & 0 & 0 & 1 & 0 & 0 & 0 & 0 & 0 & 0 & 0 \\
0 & 0 & 0 & 0 & 0 & 1 & 1 & 0 & 0 & 0 & 0 & 0 \\
0 & 0 & 0 & 1 & 0 & 0 & 0 & 0 & 0 & 0 & 0 & 0 \\
\hline
0 & 1 & 0 & 0 & 0 & 0 & 0 & 0 & 0 & 0 & 0 & 0 \\
0 & 0 & 1 & 0 & 0 & 0 & 0 & 0 & 0 & 0 & 0 & 0 \\
1 & 0 & 0 & 0 & 0 & 0 & 0 & 0 & 0 & 0 & 0 & 0
\end{array} \right)$$

FIG. 12

$$B = \begin{bmatrix}
-1 & -1 & 9 & 25 & -1 & -1 & -1 & 51 & 20 & -1 & 1 & 0 & -1 & -1 & -1 & -1 & -1 & -1 & -1 & -1 \\
16 & -1 & -1 & -1 & 50 & 55 & -1 & 31 & 41 & -1 & 0 & 0 & 0 & -1 & -1 & -1 & -1 & -1 & -1 & -1 \\
-1 & 26 & -1 & -1 & -1 & 12 & -1 & -1 & -1 & 7 & -1 & -1 & 0 & 0 & -1 & -1 & -1 & -1 & -1 & -1 \\
-1 & -1 & 12 & -1 & 43 & -1 & -1 & 31 & -1 & 15 & -1 & -1 & -1 & 0 & 0 & -1 & -1 & -1 & -1 & -1 \\
41 & -1 & -1 & -1 & -1 & -1 & 3 & 28 & -1 & -1 & -1 & -1 & -1 & -1 & 0 & 0 & -1 & -1 & -1 & -1 \\
40 & -1 & -1 & 43 & 38 & 1 & -1 & -1 & -1 & -1 & -1 & -1 & -1 & -1 & -1 & 0 & 0 & -1 & -1 & -1 \\
-1 & -1 & 25 & 37 & 29 & -1 & -1 & -1 & 34 & -1 & -1 & -1 & -1 & -1 & -1 & -1 & 0 & 0 & -1 & -1 \\
-1 & -1 & -1 & -1 & 11 & -1 & -1 & 37 & 17 & 38 & -1 & -1 & -1 & -1 & -1 & -1 & -1 & 0 & 0 & -1 \\
-1 & 56 & 13 & -1 & -1 & 5 & -1 & 47 & 33 & -1 & -1 & -1 & -1 & -1 & -1 & -1 & -1 & -1 & 0 & 0 \\
-1 & 28 & 42 & -1 & -1 & 6 & 23 & -1 & -1 & -1 & 1 & -1 & -1 & -1 & -1 & -1 & -1 & -1 & -1 & 0
\end{bmatrix}$$

FIG. 13

ENCODER AND DECODER FOR LDPC CODE

The present application claims priority to (is a US National Stage Filing of) PCT Application No. PCT/CN2016/070865 filed Jan. 14, 2016 entitled "LDPC CODE ENCODER AND DECODER". The aforementioned PCT application claims priority to Chinese Patent Application No. 201510019132.3 filed Jan. 14, 2015. The entirety of each of the two aforementioned references is incorporated herein by reference for all purposes.

FIELD OF THE INVENTION

Background

With the rapid development of communication technology and the increasingly demanding requirement for information reliability by various transmission systems, the technology of error control coding, as an important means for enabling the anti-jamming technology, is playing a more and more important role in the field of digital communication and in the digital transmission system.

A low-density parity-check (LDPC) code is a linear block code with the performance close to the theoretical maximum of communication channel. The binary LDPC code, thanks to its excellent error correction performance, has been widely used in various communication, navigation and digital storage systems. The non-binary LDPC code has also received very much attention for error correction solutions to be used in these systems.

However, most of encoders and decoders for LDPC code in the prior art are configured in a fully parallel architecture. For a fully parallel encoder, for example, the final codeword will be obtained as the product of the data $c=(c_0, c_1 \ldots c_{k-1})$ to be encoded and the generator matrix $G_{k \times n}$. As such, the so-called fully parallel encoder could be interpreted as an encoder having n data processing modules each of which is used for computing the product of $c=(c_0, c_1 \ldots c_{k-1})$ and one column of $G_{k \times n}$. Such fully parallel architecture consumes a large amount of hardware resources.

SUMMARY

This invention provides a type of data processing apparatus which can reduce the amount of hardware resource usage.

According to an aspect of the application, there is provided a type of data processing apparatus including: m data processing modules for processing $N_i$ data or operations in the i-th period following a calculation sequence, wherein $$\sum_i N_i = n$$

and m<n, where m, n and $N_i$ each are positive integers, and $$i = 1, 2 \ldots \left\lceil \frac{n}{m} \right\rceil.$$

The total n data or operations can be processed through reusing the m data processing modules in terms of time, so as to reduce the consumption of hardware resource.

According to another aspect of the application, there is provided a type of LDPC decoder including: a variable node processing unit; a check node processing unit; a memory for storing iterative messages of edges of a parity-check matrix for LDPC code; and a controller for controlling the node processing units to perform iterations of decoding until the decoding ends, wherein, in each iteration of decoding, the controller controls the variable node processing unit to compute variable node messages in a traversing manner for all variable nodes and updates the iterative messages in the memory according to the computed variable node messages, and controls the check node processing unit to compute check node messages in a traversing manner for all check nodes and updates the iterative messages in the memory according to the computed check node messages.

According to another aspect of the application, there is provided a type of LDPC decoder including: a plurality of variable node processing units; a plurality of check node processing units; a memory storing iterative messages of edges of a parity-check matrix for LDPC code; and a controller for controlling the node processing units to perform the iterations of decoding until the decoding ends, wherein, in each iteration of decoding, the controller controls the variable node processing units to compute variable node messages in a traversing manner for all variable nodes and updates the iterative messages in the memory according to the computed variable node messages, and controls the check node processing units to compute check node messages in a traversing manner for all check nodes and updates the iterative messages in the memory according to the computed check node messages.

According to another aspect of the application, there is provided a type of LDPC decoder including: a node processing unit; a first memory for storing iterative messages of variable nodes of a parity-check matrix for LDPC code; a second memory for storing iterative messages of edges of the parity-check matrix for LDPC code; and a controller for controlling the node processing unit to perform iterations of decoding until the decoding ends, wherein, in each iteration of decoding, the controller controls the node processing unit to compute, in a traversing manner, variable node messages for all variable nodes and to compute check node messages for all check nodes, following a sequence of check nodes, and updates respective iterative messages in the first memory and in the second memory according to the variable node messages and the check node messages.

According to another aspect of the application, there is provided a type of LDPC decoding method including: storing iterative messages of edges of a parity-check matrix for LDPC code; performing iterations of decoding until the decoding ends, wherein, in each iteration of decoding: successively computing variable node messages in a traversing manner for all variable nodes, and updating the iterative messages as stored accordingly; and successively computing check node messages in a traversing manner for all check nodes and updating the iterative messages as stored accordingly.

BRIEF DESCRIPTION OF THE DRAWINGS

FIG. 7 illustrates a schematic diagram of generator matrix having submatrices as circulant matrices;

FIG. 12 illustrates an exemplary parity-check matrix for LDPC code having a plurality of cyclic submatrices;

FIG. 13 illustrates a base matrix corresponding to an exemplary parity-check matrix for LDPC code of GPS;

DETAILED DESCRIPTION

Hereinafter, with reference to the appended drawings, a detailed description on the encoder and decoder for LDPC code will be presented. For simplicity, in the description of the embodiments of the present application, the same or similar numeral is used for the same or similar device.

Figure 1:
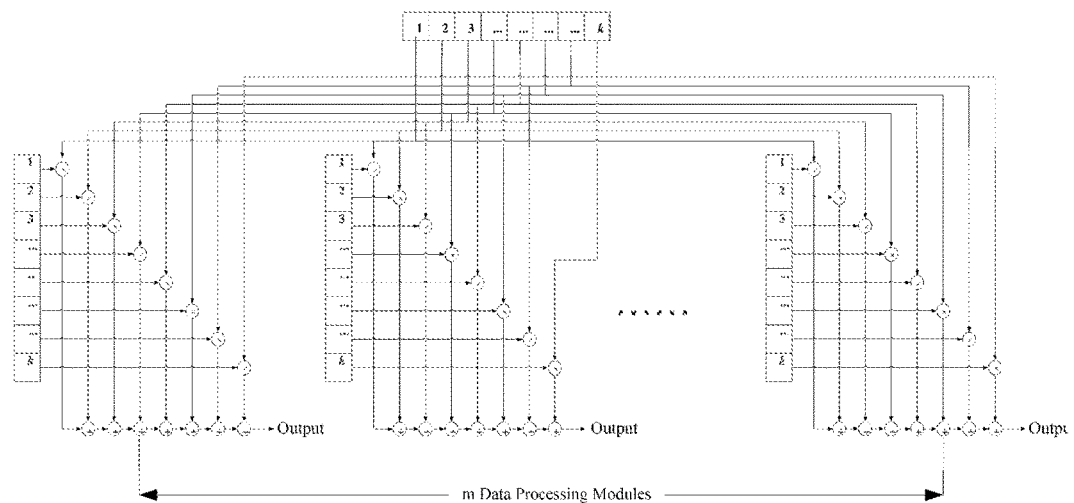
FIG. 1 illustrates a schematic diagram of fully parallel encoder in the prior art.

In the process of LDPC encoding, a final codeword is obtained as a product of the data $c=(c_0, c_1 \ldots c_{k-1})$ to be encoded and the generate matrix $G_{k \times n}$. Therefore, the encoder needs to calculate the product of $c=(c_0, c_1 \ldots c_{k-1})$ and each column of $G_{k \times n}$. FIG. 1 illustrates a schematic diagram of fully parallel encoder in the prior art. As shown in FIG. 1, the encoder may include n data processing modules, each of which is used for calculating the product of $c=(c_0, c_1 \ldots c_{k-1})$ and one column of $G_{k \times n}$. In this way, each one data processing module outputs a symbol of the final codeword. Therefore, all symbols of the codeword will be output, in one calculation period, by the n data processing modules. However, such fully parallel architecture will consume a large amount of hardware resources. For addressing this issue, a data processing apparatus is provided in the present application.

Figure 2:
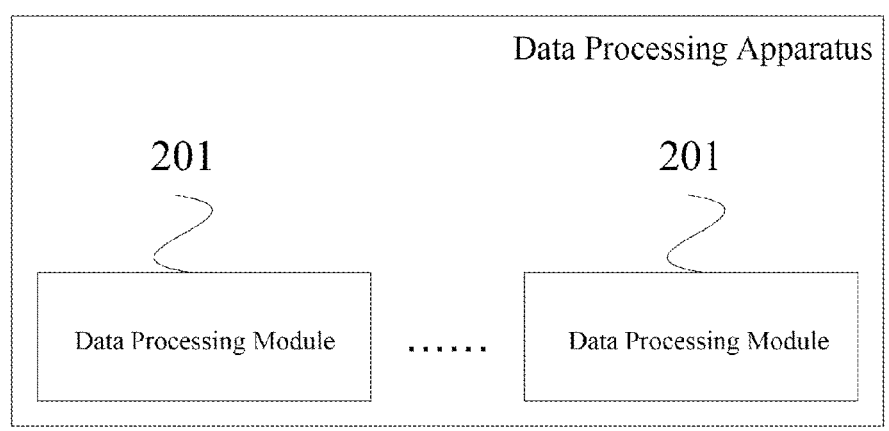
FIG. 2 illustrates a block diagram of data processing apparatus, according to an embodiment of the present application.

FIG. 2 illustrates a block diagram of data processing apparatus, according to an embodiment of the present application. The data processing apparatus is applicable in LDPC encoding or decoding as an encoder or a decoder for LDPC code. As shown in FIG. 2, the data processing apparatus may include m data processing modules 201 for processing $N_i$ data or operations in the i-th period following a calculation sequence, wherein and m<n, where m, n and $N_i$ are positive integers, and $$\sum_i N_i = n$$

$$i = 1, 2 \ldots \left\lceil \frac{n}{m} \right\rceil.$$

Specifically, for example, the product of $c=(c_0, c_1 \ldots c_{k-1})$ and $G_{k \times n}$ is calculated with the calculation sequence as $c=(c_0, c_1 \ldots c_{k-1})$ is multiplied by a column of $G_{k \times n}$ from the 1-st column to the n-th column, respectively. The data processing apparatus in the embodiment includes m data processing modules 201, where m<n. Thus, in the first period, $c=(c_0, c_1 \ldots c_{k-1})$ may be multiplied by the 1-st to m-th columns of $G_{k \times n}$ respectively, and m symbols may be output. Here, $N_i$ in the first period equals to m. In the second period, $c=(c_0, c_1 \ldots c_{k-1})$ may be multiplied by the (m+1)-th to the 2m-th columns of $G_{k \times n}$ respectively. In order to maximize the use of hardware resources, it is such that, wherever possible, each one data processing module 201 processes a datum or operation in each period. Further, in the i-th period, $N_i$ data or operations are processed. Here, the $N_i$ operations may be $N_i$ multiplication operations, and the $N_i$ data may be $N_i$ specific numbers, $N_i$ vectors or $N_i$ matrixes as well, which is not subject to any limitations by the embodiments of the present application.

Further, the data processing apparatus may also include a memory module for storing the data $c=(c_0, c_1 \ldots c_{k-1})$ to be encoded with the length of k, and a memory module for storing a column with the length of k of the generator matrix $G_{k \times n}$. Since each column of $G_{k \times n}$ is multiplied by $c=(c_0, c_1 \ldots c_{k-1})$ in sequence, it is possible to reuse the memory module that stores a column.

Furthermore, the data processing apparatus may also include one or more multipliers and one or more adders, wherein k multipliers are used for the multiplication of elements of the data $c=(c_0, c_1 \ldots c_{k-1})$ to be encoded by the corresponding elements of the generator matrix, and the k−1 adders are used for computing the sum of products of the multiplication. As such, with the multipliers and adders, the codeword could be generated.

In an embodiment of the present application, a data processing apparatus may include m data processing modules for processing $N_i$ data or operations in the i-th period following the calculation sequence, wherein $$\sum_i N_i = n$$

and m<n, where m, n and $N_i$ are positive integers, and $$i = 1, 2 \ldots \left\lceil \frac{n}{m} \right\rceil.$$

With reusing the m data processing modules in terms of time, it is possible to process n data or operations such that the consumption of hardware resources is reduced.

Figure 3:
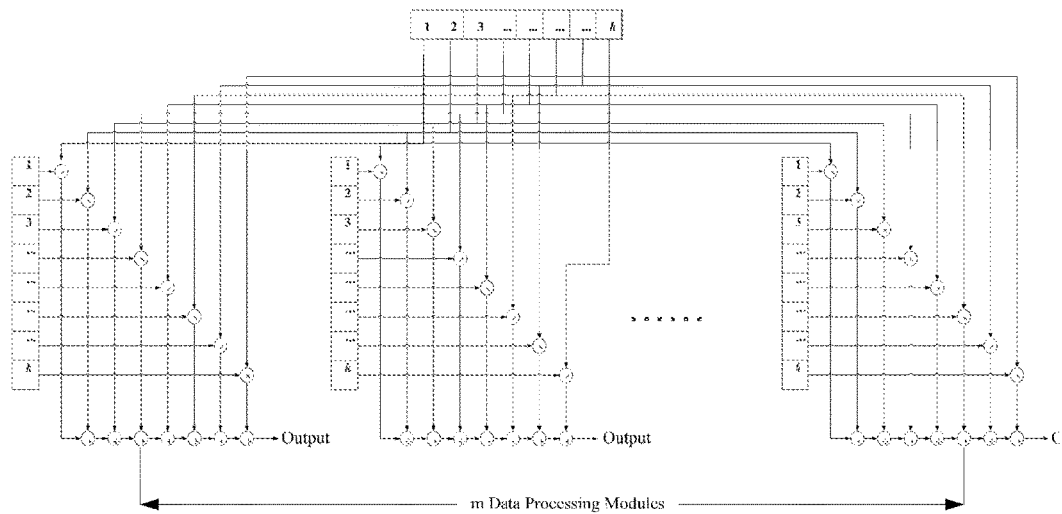
FIG. 3 illustrates a schematic diagram of data processing apparatus, according to an embodiment of the present application.

FIG. 3 illustrates a schematic diagram of data processing apparatus, according to an embodiment of the present application. The data processing apparatus may be an encoder for LDPC code, which may include m data processing modules. The m data processing modules may be used in particular for the following: during an LDPC encoding, data $c=(c_0, c_1 \ldots c_{k-1})$ to be encoded will be multiplied by each column of the generator matrix $G_{k \times n}$, wherein k stands for the length of data to be encoded, and n stands for the number of columns of the generator matrix $G_{k \times n}$; $c=(c_0, c_1 \ldots c_{k-1})$ is multiplied by $N_i$ columns of the generator matrix $G_{k \times n}$ in the i-th period, wherein for the 1-st to $$\left\lfloor \frac{n}{m} \right\rfloor - th$$

period, $N_i=m$, where $$i = 1, 2 \ldots \left\lfloor \frac{n}{m} \right\rfloor;$$

if n cannot be divided exactly by m, for the $$\left\lceil \frac{n}{m} \right\rceil - th$$

period, $N_i=n \bmod m$, where $$i = \left\lceil \frac{n}{m} \right\rceil.$$

Considering that the data processing apparatus includes m data processing modules, the degree of parallelism can be denoted as m.

For example, assuming that m=3, k=3, n=5, during the process of LDPC encoding, in the first period, three data processing modules calculate the multiplication of $c=(c_0, c_1, c_2)$ by the first, second and third columns of the generator matrix $G_{3 \times 5}$, respectively; in the second period, two of the three data processing modules calculate the multiplication of $c=(c_0, c_1, c_2)$ by the fourth and fifth columns of the generator matrix $G_{3 \times 5}$, respectively.

Further, the data processing apparatus may also include a memory module for storing the data $c=(c_0, c_1 \ldots c_{k-1})$ to be encoded with the length of k, and a memory module for storing a column with the length of k of the generator matrix $G_{k \times n}$. Since each column is multiplied by $c=(c_0, c_1 \ldots c_{k-1})$ in sequence, it is possible to reuse the memory module that stores a column.

Furthermore, the data processing apparatus may also include one or more multipliers and one or more adders, wherein k multipliers are used for the multiplication of elements of the data $c=(c_0, c_1 \ldots c_{k-1})$ to be encoded by the corresponding elements of the generator matrix, and k−1 adders are used for computing the sum of products of the multiplication. As such, with the multipliers and adders, the codeword could be generated.

In an embodiment of the present application, a data processing apparatus may include m data processing modules. The m data processing modules may be used in particular for the following: during the process of LDPC encoding, the data $c=(c_0, c_1 \ldots c_{k-1})$ to be encoded will be multiplied by each column of $G_{k \times n}$, wherein k stands for the length of data to be encoded, and n stands for the number of columns of the generator matrix $G_{k \times n}$; $c=(c_0, c_1 \ldots c_{k-1})$ is multiplied by $N_i$ columns of the generator matrix $G_{k \times n}$ in the i-th period, wherein for the 1-st to $$\left\lfloor \frac{n}{m} \right\rfloor - th$$

period, $N_i=m$, where $$i = 1, 2 \ldots \left\lfloor \frac{n}{m} \right\rfloor;$$

if n cannot be divided exactly by m, for the $$\left\lceil \frac{n}{m} \right\rceil - th$$

period, $N_i=n \bmod m$, where $$i = \left\lceil \frac{n}{m} \right\rceil.$$

As such, the reuse in terms of time of data processing modules is enabled, such that consumption of hardware resources is reduced.

Figure 4:
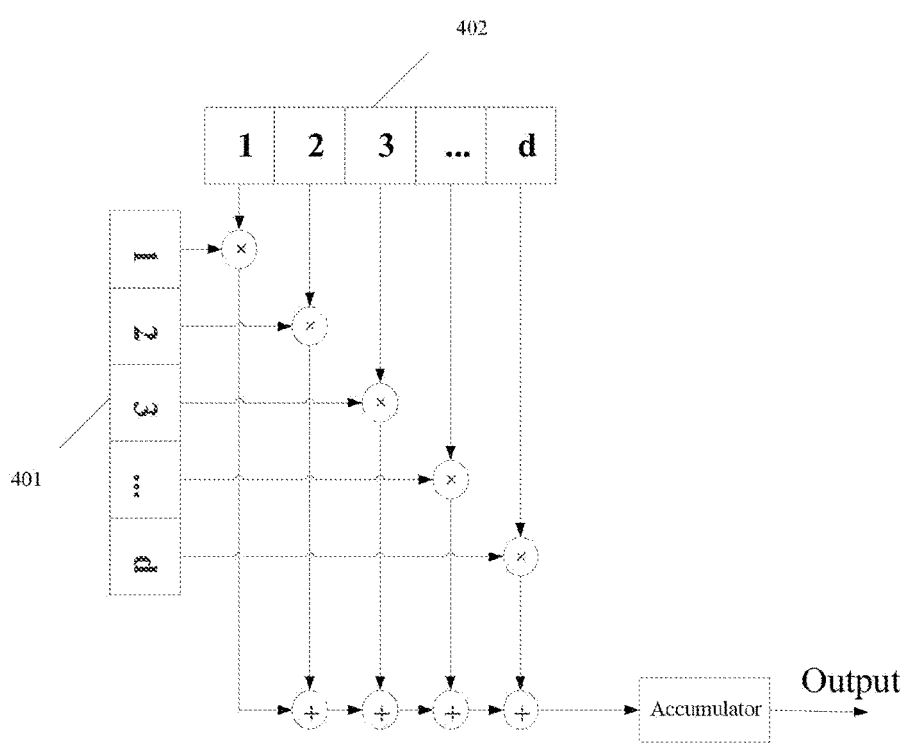
FIG. 4 illustrates a schematic diagram of data processing apparatus, according to an embodiment of the present application.

FIG. 4 illustrates a schematic diagram of data processing apparatus, according to an embodiment of the present application. In the embodiment, each column of the generator matrix $G_{k \times n}$ is partitioned based on the block construction. A data processing module in the data processing apparatus may include a first storage unit 401 and a second storage unit 402. The data processing module may be used for partitioning each column of the generator matrix $G_{k \times n}$ into P number of first data blocks, where P≥2. As shown in FIG. 4, the first storage unit 401 may be used for storing one of the first data blocks, and the second storage unit 402 may be used for storing a second data block of the data to be encoded to which said one of the first data blocks corresponds. The first storage unit 401 as shown is storing a first data block with the length of d, and the second storage unit 402 as shown is storing a second data block with the length of d. Of course, the data processing module may also comprise one or more multipliers, one or more adders and one or more accumulators. The m data processing modules may be used in particular for the following: during the LDPC encoding, according to the result of partitioning, $N_i$ second data blocks are multiplied by respective first data blocks in the i-th period, wherein for first $$\left\lfloor \frac{n}{m} \right\rfloor \times P$$

periods, $N_i=m$, where $$i = 1, 2 \ldots \left\lfloor \frac{n}{m} \right\rfloor \times P;$$

if n cannot be exactly divided by m, then for the $$\left(\left\lceil \frac{n}{m} \right\rceil \times P + 1\right) - th$$

to the $$\left(\left\lceil \frac{n}{m} \right\rceil \times P + P\right) - th$$

periods, $N_i=n \bmod m$, where $$i = \left\lceil \frac{n}{m} \right\rceil \times P + 1, \left\lceil \frac{n}{m} \right\rceil \times P + 2 \ldots \left\lceil \frac{n}{m} \right\rceil \times P + P.$$

Specifically, the first storage unit can be reused for the first data blocks, and the second storage unit can also be reused for the second data blocks. That is to say, without any extra storage space, one single first storage unit is to be used for all of the first data blocks in chronological sequence, and one single second storage unit is to be used for all of the second blocks in chronological sequence.

For example, assuming that m=3, k=3, n=5, P=2, then each column of the generator matrix $G_{3\times 5}$ is partitioned into 2 first data blocks. In particular, for each column, from top to bottom, the first element constitutes a first data block, and the second and the third elements constitute another first data block. As such, the generator matrix $G_{3\times 5}$ actually comprises 10 first data blocks. Correspondingly, the data to be encoded $c=(c_0, c_1, c_2)$ is also partitioned into 2 second data blocks. In particular, from left to right, the first element $c_0$ constitutes a second data block, and the second element $c_1$ and the third element $c_2$ constitute another second data block. As such, during the encoding for LDPC code, based on the calculation sequence, in the first period, 3 data processing modules calculate the product of the second data block constituted by the first element of $c=(c_0, c_1, c_2)$ and the first data block constituted by the first element of the first column of the generator matrix $G_{3\times 5}$, the product of the second data block constituted by the first element of $c=(c_0, c_1, c_2)$ and the first data block constituted by the first element of the second column of the generator matrix $G_{3\times 5}$, and the product of the second data block constituted by the first element of $c=(c_0, c_1, c_2)$ and the first data block constituted by the first element of the third column of the generator matrix $G_{3\times 5}$, respectively. In the second period, 3 data processing modules calculate the product of the second data block constituted by the second and third elements of $c=(c_0, c_1, c_2)$ and the first data block constituted by the second and third elements of the first column of the generator matrix $G_{3\times 5}$, the product of the second data block constituted by the second and third elements of $c=(c_0, c_1, c_2)$ and the first data block constituted by the second and third elements of the second column of the generator matrix $G_{3\times 5}$, and the product of the second data block constituted by the second and third elements of $c=(c_0, c_1, c_2)$ and the first data block constituted by the second and third elements of the third column of the generator matrix $G_{3\times 5}$, respectively. Then, the results calculated in the second period are accumulated with the results calculated in the first period, and so on. In this way, it is possible to realize the reuse of data processing modules.

According to an embodiment, a data processing module of a data processing apparatus may include a first storage unit and a second storage unit. The data processing module may be used for partitioning each column of the generator matrix $G_{k\times n}$ into P first data blocks. The first storage unit may be used for storing one first data block. The second storage unit may be used for storing a second data block of the data to be encoded to which said one first data block corresponds. m data processing modules may be used in particular for the following: during the encoding for LDPC code, according to the partitioning manner, $N_i$ second data blocks are multiplied by corresponding $N_i$ first data blocks in the i-th period, wherein $N_i$=m for first $$\left\lfloor \frac{n}{m} \right\rfloor \times P$$

periods, where $$i = 1, 2 \ldots \left\lfloor \frac{n}{m} \right\rfloor \times P;$$

if n cannot be divided exactly by m, then for the $$\left(\left\lceil \frac{n}{m} \right\rceil \times P + 1\right)\text{-}th$$

to the $$\left(\left\lceil \frac{n}{m} \right\rceil \times P + P\right)\text{-}th$$

periods, $N_i$=n mod m, $$i = \left\lceil \frac{n}{m} \right\rceil \times P + 1, \left\lceil \frac{n}{m} \right\rceil \times P + 2 \ldots \left\lceil \frac{n}{m} \right\rceil \times P + P.$$

Thereby, it is possible to improve the utilization efficiency of data processing module, the first storage unit and the second storage unit, and to reduce the calculating complexity of each data processing module.

According to an embodiment, the data processing apparatus enables the reuse of storage space based on the thoughts of obtaining final codeword symbols by using parity-check matrix. In particular, the method for obtaining final codeword symbols by using the parity-check matrix includes: assuming that the data to be encoded is $M=(m_0, m_1 \ldots m_{k-1})$, the parity-check matrix is $H_{r\times n}$, and parity-check symbols are $p_1, p_2 \ldots p_{n-k}$, then $(M, p_1, p_2 \ldots p_{n-k})H_{r\times n}^T=0$; assuming that the parity-check matrix is $H_{r\times n}=(QI)$, wherein Q is a matrix with the size of $(n-k)\times k$ and corresponds to M, I is a matrix with the size of $(n-k)\times(n-k)$ and corresponds to redundant bits of the encoded data. When I is a quasi-dual-diagonal matrix, i.e., all of elements of I except those on the diagonal and directly above or under the diagonal are 0. In view of the fact that $(M, p_1, p_2 \ldots p_{n-k})H_{r\times n}^T=0$, the first redundant symbol $p_1$ could be directly obtained according to elements of the data to be encoded, the second redundant symbol $p_2$ could be obtained according to the first redundant bit $p_1$ together with elements of the data to be encoded, and similarly, $p_{n-k}$ could be obtained according to $p_{n-k-1}$ together with elements of the data to be encoded. Thus, an information bit of $(M, p_1, p_2 \ldots p_{n-k})$ to which the first non-zero element in the first row of the parity-check matrix corresponds could be firstly read from a storage module storing $(M, p_1, p_2 \ldots p_{n-k})$, said first non-zero element could be read from a storage module storing the parity-check matrix, the information bit and the first non-zero element which have been read could be multiplied, and the result of multiplication could be stored in a accumulator. Then, an information bit of $(M, p_1, p_2 \ldots p_{n-k})$ to which the second non-zero element in the first row of the parity-check matrix corresponds could be read from the storage module storing $(M, p_1, p_2 \ldots p_{n-k})$, said second non-zero element could be read from the storage module storing the parity-check matrix, the information bit and the second non-zero element could be multiplied, and the result of multiplication could be accumulated to the previous result stored in the accumulator. As such, further operations could be conducted in the similar manner until the first parity-check symbol is obtained, and the result accumulated in the accumulator could be stored in the storage module storing $(M, p_1, p_2 \ldots p_{n-k})$. Finally, the accumulator could be cleared, and the above steps could be repeated until all the redundant bits are obtained. The above procedure enables the reuse of storage space in the sequence of calculation.

Figures 5, 6:
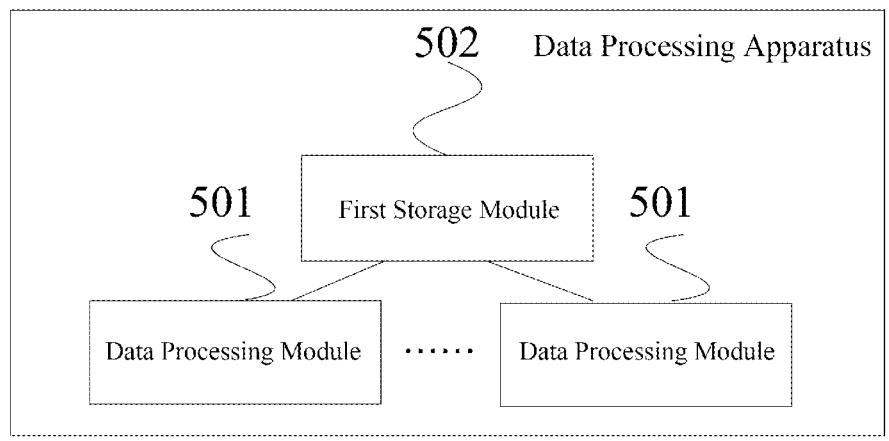
FIG. 5 illustrates a block diagram of data processing apparatus, according to an embodiment of the present application.
FIG. 6 illustrates a schematic diagram of sparse generator matrix.

FIG. 5 illustrates a block diagram of data processing apparatus, according to an embodiment of the present application. On the basis of embodiments described as above, the data processing apparatus may include, in addition to m data processing modules 501, a first storage module 502 used for storing the generator matrix.

Specifically, the first storage module 502 may be used for:
(1) If the generator matrix is a sparse matrix, the first storage module only stores non-zero elements of the generator matrix and positions to which the non-zero elements correspond.

In particular, a matrix contains non-zero elements far less than the total elements in number, and thus known as a sparse matrix, for which the first storage module only stores the non-zero elements in the generator matrix and positions in the generator matrix to which the non-zero elements correspond. Further, in the scenario of binary LDPC code, any of non-zero elements in the generator matrix is 1, and therefore the first storage module only needs to store positions to which the non-zero elements of 1 correspond.

(2) If sub-matrices of the generator matrix are circulant matrices, the first storage module only stores values of all non-zero elements in the circulant matrices, a position to which a non-zero element in a column corresponds and cyclic offset of two adjacent columns.

In particular, if the sub-matrices of the generator matrix are circulant matrices, the generator matrix is denoted as a quasi-circulant matrix. As for a generator matrix, i.e., $$G_{k \times n} = \begin{pmatrix} G_{11} & G_{12} & \cdots & G_{1r} \\ G_{21} & G_{22} & \cdots & G_{2r} \\ \vdots & \vdots & & \vdots \\ G_{s1} & G_{s2} & \cdots & G_{sr} \end{pmatrix},$$

wherein G is a circulant matrix, where (i=1, 2 ... s; j=1, 2 ... r), based on features of circulant matrix, the first storage module only stores values of all non-zero elements, the position to which a non-zero element in a column corresponds and the cyclic offset of two adjacent columns. For example: a q×q circulant matrix $$G_{11} = \begin{pmatrix} 0 & g_1 & \cdots & 0 \\ 0 & 0 & \cdots & 0 \\ \vdots & \vdots & & \vdots \\ 0 & 0 & \cdots & g_{q-1} \\ g_0 & 0 & \cdots & 0 \end{pmatrix},$$

the first storage module could only store values of q non-zero elements, the position to which the non-zero element $g_0$ in the first column corresponds and the cyclic offset "1" of the adjacent columns. As such, non-zero elements in other columns could be obtained according to the position to which the non-zero element in the first column corresponds and the cyclic offset. Further, in the scenario of the binary LDPC code, any of non-zero elements in the generator matrix is 1, and therefore the first storage module only needs to store positions to which non-zero elements of 1 correspond and the cyclic offset.

In an embodiment of the present application, a data processing apparatus may include a first storage module for storing the generator matrix. If the generator matrix is a sparse matrix, the first storage module only stores non-zero elements of the generator matrix and positions to which the non-zero elements correspond. If sub-matrices of the generator matrix are circulant matrices, the first storage module only stores values of all non-zero elements in the circulant matrices, the position to which a non-zero element in a column corresponds and the cyclic offset of two adjacent columns. As such, the reuse of the first storage module is enabled so that the consumption of hardware resources is reduced.

FIG. 6 illustrates a schematic diagram of sparse generator matrix. As shown in FIG. 6, when m=3, P=4, data as stored at the first address in the first storage module 502 are (1,3,0) which indicate positions of non-zero elements in the first row block of the first column block. Specifically, the first data processing module, according to the value of 1, sets the first bit of its first storage module 401 as 1, and the second data processing module, according to the value of 3, sets the third bit of its first storage module 401 as 1. Data stored at the second address in the first storage module 502 are (0,0,1) which indicate positions of non-zero elements in the second row block of the first column block. Specifically, the third data processing module, according to the value of 1, sets the first bit of its first storage module 401 as 1. As such, it is possible to completely indicate the whole generator matrix by storing totally 12 groups of data, and the data processing module could complete the encoding only by storing positions of non-zero elements in the first storage module for each data block. In contrast, for the non-binary LDPC code, it is necessary to store the value of non-zero elements.

FIG. 7 illustrates a schematic diagram of generator matrix having submatrices as circulant matrices. As shown in FIG. 7, when m=3, P=4, data as stored at the first address in the first storage module 502 are (1,1,1) which indicate that the first non-zero sub-matrix of the first column block is located in the first row block, a non-zero element in the first column is located in the first row, the cyclic offset is 1 (the cyclic offset could not be stored when the value of offset is fixed). The first data processing module sets the first bit of its first storage module 401 as 1, the second data processing module sets the second bit of its first storage module 401 as 1, and the third data processing module sets the third bit of its first storage module 401 as 1. Data as stored at the second address in the first storage module 502 are (4,3,1) which indicate that the second non-zero sub-matrix of the first column block is located in the fourth row block, a non-zero element in the first column is located in the third row, the cyclic offset is 1. The first data processing module sets the third bit of its first storage module 401 as 1, the second data processing module sets the first bit of its first storage module 401 as 1, and the third data processing module sets the second bit of its first storage module 401 as 1. As such, it is possible to completely indicate the whole generator matrix by storing totally 6 groups of data, and the data processing module could complete the encoding only by storing positions of non-zero elements in the first storage module for each of data block. In contrast, for the non-binary LDPC code, it necessary to store the value of non-zero elements.

Figures 8, 9:
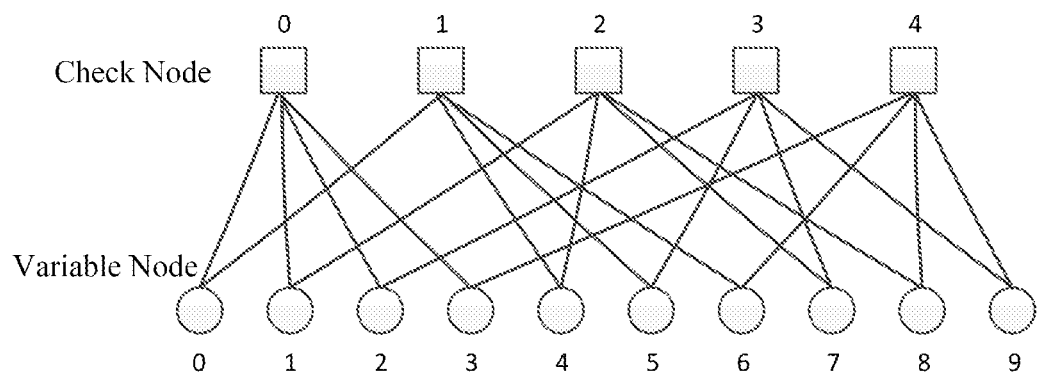
FIG. 8 illustrates an exemplary parity-check matrix for LDPC code.
FIG. 9 illustrates the Tanner graph corresponding to the parity-check matrix in FIG. 8.

According to another aspect of the present application, a decoder and decoding method for LDPC code are also provided. As appreciated by those skilled in the art, the structure of decoder is relatively complicated. The decoding algorithm employed in the decoder and decoding method of present application may be any iterative decoding algorithm, such as the belief-propagation algorithm, the min-sum algorithm, or the message-passing algorithm and so on. The iterative decoding algorithm is realized based on the Tanner graph of the parity-check matrix for LDPC code. FIG. 8 illustrates an exemplary parity-check matrix for LDPC code. FIG. 9 illustrates the Tanner graph to which the parity-check matrix in FIG. 8 corresponds, wherein a column of the parity-check matrix corresponds to a variable node, a row of the parity-check matrix corresponds to a check node, and a line connecting the variable node with the check node corresponds to a non-zero element of the parity-check matrix and is known as an edge. The process of decoding may be regarded as an iterative process during which iterative messages are passed between variable nodes and check nodes through edges.

Hereinafter, the decoder and decoding method for LDPC code according to embodiments of the present application will be described in detail with reference to the drawings.

Figure 10:
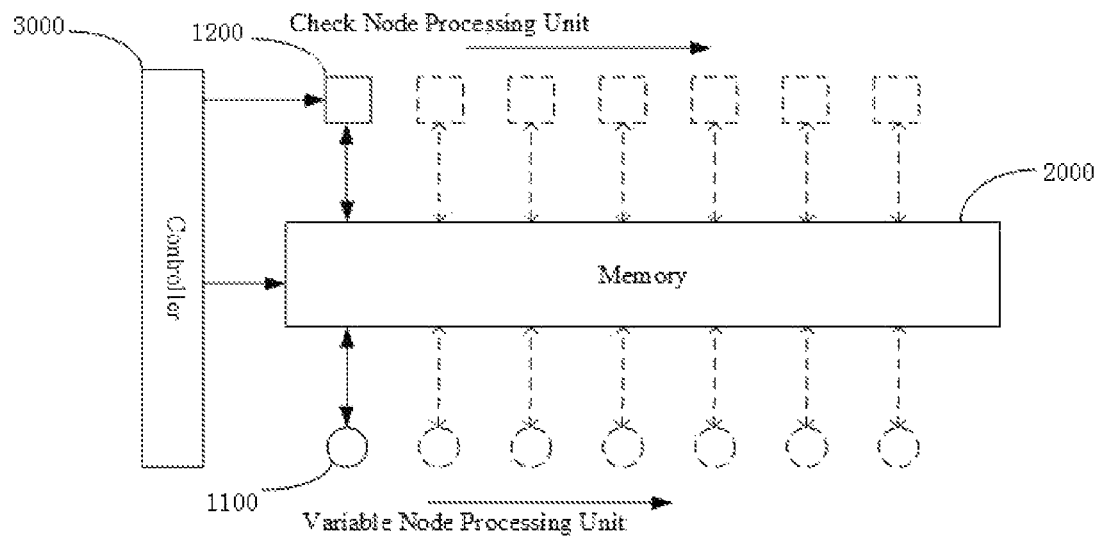
FIG. 10 illustrates a block diagram of decoder for LDPC code, according to an embodiment of the present application.

FIG. 10 illustrates a block diagram of decoder for LDPC code, according to an embodiment of the present application. The decoder for LDPC code includes a variable node processing unit 1100, a check node processing unit 1200, a memory 2000, and a controller 3000. The variable node processing unit 1100 may store iterative messages of edges of parity-check matrix for LDPC code. The iterative message may include, for example, a codeword symbol and confidence of each edge of the parity-check matrix for LDPC code. The controller 3000 may control the node processing units to perform iterations of decoding until the decoding ends. Here, in each iteration of decoding, the controller controls the variable node processing unit 1100 to compute variable node messages in a traversing manner for all variable nodes, and may update the iterative messages in the memory with the computed variable node messages. The variable node message of a variable node may include, for example, a codeword symbol and confidence of each edge to which the variable node corresponds. The controller 3000 also controls the check node processing unit 1200 to compute check node messages in a traversing manner for all check nodes, and may update the iterative messages in the memory 2000 according to the computed check node messages. The check node message of a check node includes, for example, a codeword symbol and confidence of each edge to which the check node corresponds.

According to embodiments of the present application, with only one variable node processing unit and one check node processing unit, it is possible to realize the whole iterations of decoding in a serial manner. In addition, IO ports between the variable node processing unit and the check node processing unit are connected through the memory under control of the controller rather than directly. With the reuse in terms of time of the node processing units, hardware resources are saved significantly, and the cost is reduced.

As appreciated by those skilled in the art, the decoder according to the present application may be used both for the binary LDPC code and for the non-binary LDPC code. For binary LDPC code, the codeword symbol in the iterative message may be the hard-decision, and the confidence in the iterative message may be the value of LLR. For non-binary LDPC code, the iterative message may include a plurality of codeword symbols and corresponding confidences to which each edge of the parity-check matrix corresponds. The codeword symbols and corresponding confidences may be in the form of message vector. In the scenario of non-binary LDPC code, the hard-decision means a codeword symbol with the highest confidence. In each iteration of decoding, the controller 3000 may control the variable node processing unit to compute variable node messages (including the codeword symbol and confidence of each edge to which the variable node corresponds) for all variable nodes in a traversing manner, and may update the iterative messages in the memory according to the computed variable node messages. The controller 3000 may control the check node processing unit to compute check node messages (including the confidence of the edge to which the check node corresponds) of all check nodes in a traversing manner, and may update the iterative message in the memory according to the computed results for check nodes.

According to an embodiment of the present application, when performing a computation for a variable node, an original confidence of the variable node needs to be obtained by the variable node processing unit. The original confidence is an input information of the encoder, which is obtained by demodulating a receiving signal of the receiver through a front-end device (a demodulator, for example) of the receiver. The origin confidence may be stored in an input buffer (not shown). When performing a current computation for a variable node, the variable node processing unit 1100 may get an original confidence to which the variable node involved in the current computation corresponds, and obtain from the memory 2000 the iterative message of each edge to which the variable node involved in the current calculation corresponds, perform the computation for the variable node based on the obtained original confidence and iterative message so as to obtain the codeword symbol and confidence of each edge to which the variable node involved in the current computation corresponds, and correspondingly update the codeword symbol and confidence of the iterative message stored in the memory for each edge to which the variable node involved in the current calculation corresponds.

When performing a current computation for a check node, the check node processing unit 1200 may obtain from the memory 2000 the iterative message of each edge to which the check node involved in the current calculation, perform the computation for the check node based on the obtained iterative message so as to obtain the confidence of each edge to which the check node involved in the current calculation, and update the confidence in the iterative message stored in the memory for each edge to which the check node in the current check corresponds.

Figure 11:
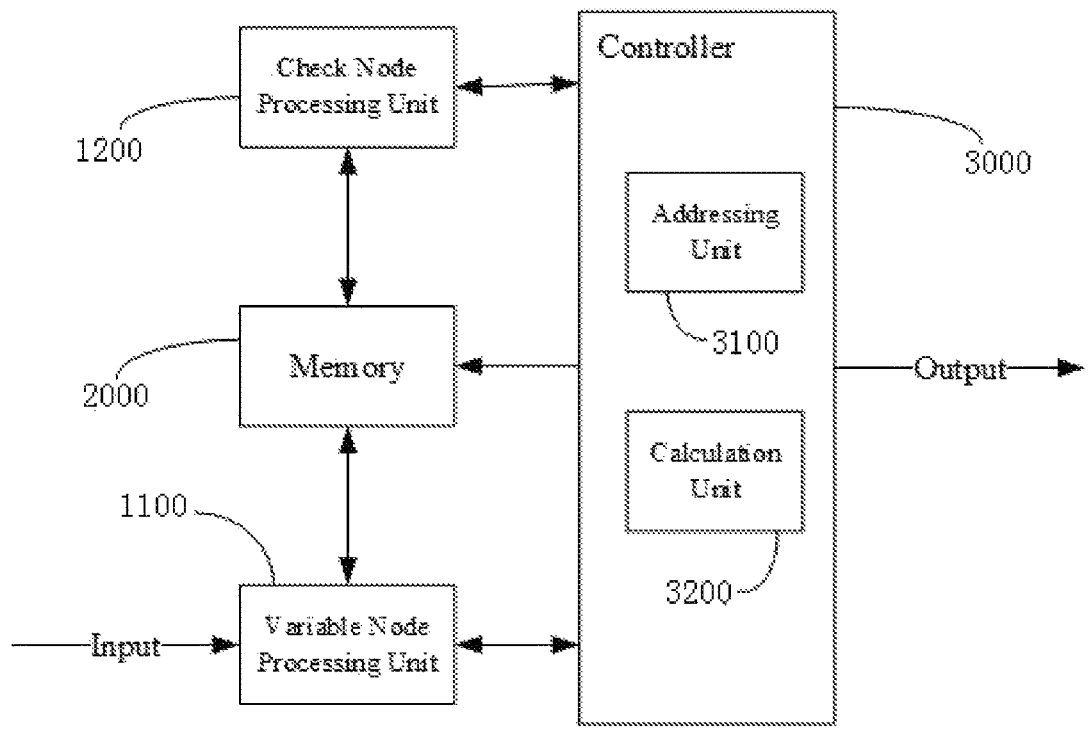
FIG. 11 illustrates a block diagram of decoder for LDPC code, according to an embodiment of the present application.

FIG. 11 illustrates a block diagram of decoder for LDPC code, according to an embodiment of the present application. As shown in FIG. 11, the decoder for LDPC code may include a variable node processing unit 1100, a check node processing unit 1200, a memory 2000 and a controller 3000. The controller may further include an addressing unit 3100 and a calculation unit 3200. The addressing unit 3100 may provide an addressing for the communication between the variable node processing unit 1100 and the memory 2000. For example, the addressing unit 3100 may store a first mapping relationship between a traversing sequence of the variable node processing unit for all variable nodes and a storing sequence of the memory for edges of the parity-check matrix. The addressing unit 3100 may also provide an addressing for the communication between the check node processing unit 1200 and the memory 2000. For example, the addressing unit 3100 may also store a second mapping relationship between a traversing sequence of the check node processing unit for all check nodes and a storing sequence of the memory for edges of the parity-check matrix.

The calculation unit 3200 may count the number of computations of the variable node processing unit 1100 so as to determine a state of current variable node computation.

The addressing unit 3100 may determine a first current mapping address according to the state of current variable node computation. The iterative message in the memory can be updated by the variable node processing unit 1100 according to the first current mapping address determined by the addressing unit 3100. For example, according to the address determined by the addressing unit 3100, the variable node processing unit 1100 may read from the memory 2000 the iterative message required for performing the current variable node computation, and store the variable node message obtained through the current variable node computation at the corresponding address in the memory 2000 so as to update the iterative message.

After the variable node processing unit 1100 completes the variable node computation in a traversing manner for all variable nodes in the parity-check matrix for LDPC code, the calculation unit 3200 may count the number of computations of the check node processing unit 1200 so as to determine a state of current check node computation. The addressing unit 3100 may determine a second current mapping address according to the state of current check node computation. The iterative message in the memory can be updated by the check node processing unit 1200 according to the second current mapping address determined by the addressing unit 3100. For example, according to the address determined by the addressing unit 3100, the check node processing unit 1200 may read from the memory 2000 the iterative message required for performing the current check node computation, and store the check node message obtained through the current check node computation at the corresponding address in the memory 2000 so as to update the iterative message.

After an iteration of decoding ends, the controller 3000 may determine whether the checksum for each check node is zero. If all checksums for check nodes each are zero, the decoding succeeds; if not, a next iteration of decoding will be performed through the control of the controller. If the number of iterations reaches the maximum, the decoding fails. The checksum for a check node is the sum of products of hard-decisions of edges to which the check node corresponds multiplied by non-zero elements at positions in the parity-check matrix corresponding to the edges.

In practical, the parity-check matrix for LDPC code usually includes a plurality of circulant matrices and a plurality of zero matrices. Only non-zero elements in the circulant matrices need to be taken into account during decoding. FIG. 12 illustrates an exemplary parity-check matrix for LDPC code having a plurality of circulant matrices.

In each circulant matrix, one variable node is only connected with one check node forming an edge, and such connection is only affected by an offset in circulant matrix. Therefore, for each circulant matrix, the addressing unit 3100 may store only one mapping address for the communication between the variable node processing unit 1100 and the memory 2000, such that the variable node processing unit 1100 could realize the update of the iterative messages stored in the memory 2000 for all edges in the whole circulant matrix. Likewise, for each circulant matrix, the addressing unit 3100 may store only one mapping address for the communication between the check node processing unit 1200 and the memory 2000, such that the check node processing unit 1200 could realize the update of the iterative messages stored in the memory 2000 for all edges in the whole circulant matrix. Thus, it is possible to further save the hardware resources and reduce the cost.

According to an embodiment of the present application, for each circulant matrix, the iterative messages of edges in the circulant matrix may be stored in sequence in the memory 2000. In the addressing unit 3100, only a first mapping address for an edge in the memory 2000 to which any variable node in the circulant matrix corresponds may be stored. For example, only a first mapping address of an edge in the memory to which the first variable node in the circulant matrix corresponds is stored. First mapping addresses of edges in the memory to which other variable nodes in the circulant matrix correspond may be directly determined according to the cyclic rule of the circulant matrix. For example, said first mapping addresses may be determined according to the known first mapping address and an offset in the circulant matrix and/or positions of said other variable nodes relative to the variable node to which the known first mapping address corresponds. Likewise, in the addressing unit 3100, a second mapping address of an edge in the memory 2000 to which any check node in the circulant matrix corresponds needs to be stored. For example, only a second mapping address of an edge in the memory to which the first check node in the circulant matrix corresponds is stored. First mapping addresses of edges in the memory to which other check nodes in the circulant matrix correspond may be directly determined according to the cyclic rule of the circulant matrix. For example, said second mapping addresses may be determined according to the known second mapping address and an offset in the circulant matrix and/or positions of said other check nodes relative to the check node to which the known second mapping address corresponds.

In addition, if the traversing sequence of the variable node processing unit 1100 for variable nodes in all the circulant matrices is in consistent with the storing sequence of the memory 2000 for the iterative messages of edges of all circulant matrices in the parity-check matrix for LDPC code, then the addressing unit 3100 may not store any mapping addresses for the communication between the variable node processing unit 1100 and the memory 2000, and instead, according to the counting by the controller 3000, the auto-increment addressing is enabled between the variable node processing unit 1100 and the memory 2000. Likewise, if the traversing sequence of the check node processing unit 1200 for check nodes in all circulant matrices is in consistent with the storing sequence of the memory 2000 for the iterative messages of edges of all circulant matrices in the parity-check matrix for LDPC code, then the addressing unit 3100 may not store any mapping addresses for the communication between the check node processing unit 1200 and the memory 2000, and instead, according to the counting by the controller 3000, the auto-increment addressing is enabled between the check node processing unit 1200 and the memory 2000.

The implementation of the decoder in a serial manner according to the present application is especially suitable for technical fields where the requirement of receiver for the consumption in hardware resources is strict but that for the throughput is not, such as the field of satellite navigation. Hereinafter, a detailed description of the operation of decoder will be provided with the LDPC code of GPS system as an example. According to the present embodiment, a (1200, 600) LDPC code in the GPS system having the circulant matrix in size of 60×60 is considered.

FIG. 13 illustrates a base matrix to which an exemplary parity-check matrix for LDPC code of GPS corresponds. Each number in the base matrix stands for a 60×60 submatrix, such as a zero matrix and a circulant matrix. In particular, the number of "−1" stands for a zero matrix while other numbers stand for a circulant matrix and the value of number stands for an offset of the circulant matrix. For example, the number of "0" stands for no offset, i.e. a unit matrix, and the number of "16" stands for a matrix obtained through cyclically shifting rightward a unit matrix by 16 bits.

Figure 14:
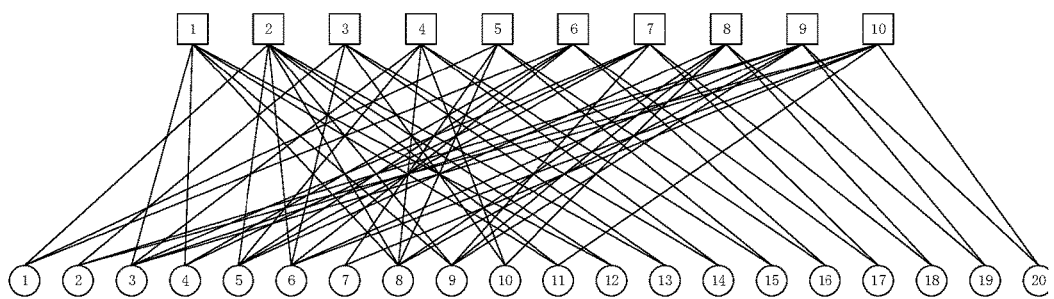
FIG. 14 illustrates the Tanner graph corresponding to the matrix in FIG. 13.
Figure 15:
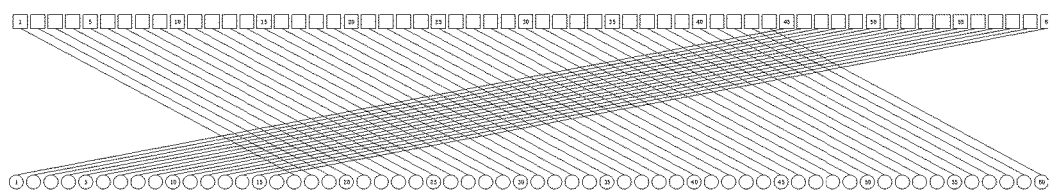
FIG. 15 illustrates variable nodes, check nodes and edges corresponding to a block edge in FIG. 14.

FIG. 14 illustrates the Tanner graph to which the matrix in FIG. 13 corresponds. As shown in FIG. 14, each square stands for a group of 60 check nodes, each circle stands for a group of 60 variable nodes, and each edge stands for a block edge. FIG. 15 illustrates variable nodes, check nodes and edges to which a block edge in FIG. 14 corresponds. As shown, for example, a block edge connecting the group 1 of variable nodes with the group 2 of check nodes corresponds to the number 16 at the second row and the first column in the base matrix.

In the present embodiment, the variable node processing unit 1100 may be implemented through VNU, the check node processing unit 1200 may be implemented through CNU, and the memory 2000 may be implemented through RAM.

Each storage address in RAM may correspond to a non-zero element in the parity-check matrix for LDPC code, i.e. an edge as shown in FIG. 15. RAM stores the iterative messages of the parity-check matrix for LDPC code based on a group position sequence (e.g., column sequence) of a sub-matrix (circulant matrix) in the base matrix to which an edge in the parity-check matrix corresponds, a group port sequence (e.g., row sequence of each column) of the sub-matrix, and a position of the edge in the circulant matrix group (e.g., in-group column sequence).

In this connection, the calculation unit of controller may count the number of computations processed by VNU or CNU, so as to obtain the group position where the edge involved in the current computation is in, i.e., unitnum, the in-group position of the edge, i.e., groupnum, and the current I/O port number, i.e., portnum. In addition, where the circulant matrix is irregularly distributed in the base matrix (i.e., the weight of row or column is not fixed), the calculation unit or addressing unit of controller may record the total number of non-zero rows in each column of base matrix, i.e., Max_port_V, and may record the total number of non-zero columns in each row of base matrix, i.e., Max_port_C. As those skilled in the art could appreciate, when the calculation unit of controller counts the number of computations processed by VNU, the group position unitnum stands for the column sequence of the circulant matrix in the base matrix, where the circulant matrix corresponds to an edge to which the variable node involved in the current variable node computation corresponds, the I/O port number portnum stands for the row sequence in the column of the circulant matrix in the base matrix to which the edge corresponds, and the position in group groupnum stands for the column position of the edge in the circulant matrix. When the calculation unit of controller counts the number of computations processed by CNU, the group position unitnum stands for the row sequence of the circulant matrix in the base matrix, where the circulant matrix corresponds to an edge to which the check node involved in the current check node computation corresponds, the I/O port number portnum stands for the column sequence in the row of the circulant matrix in the base matrix to which the edge corresponds, and the position in group groupnum stands for the row position of the edge in the circulant matrix.

The addressing unit may record a mapping relationship between storage addresses in RAM grp_addr, and the group position unitnum, the I/O port number portnum and the position in group groupnum. For example, the addressing unit may store a mapping table between storage addresses grp_addr, and (unitnum, portnum, groupnum) of VNU, and may store a mapping table between storage addresses grp_addr, and (unitnum, portnum, groupnum) of CNU.

In each circulant matrix, the relationship of the edge with the variable node and check node is unique and fixed (determined by the offset), and thus, for a circulant matrix, the addressing unit may only record a mapping relationship of the storage addresses in RAM with the group position unitnum, the I/O port number portnum and any position in group (e.g., groupnum=0), and may record an offset of the circulant matrix, so as to determine the mapping addressing relationship for the whole circulant matrix. For example, the addressing unit may store a mapping table between the storage addresses grp_addr and (unitnum, portnum) of VNU, and may store a mapping table between the storage addresses grp_addr and (unitnum, portnum) of CNU.

In the process of decoding by the decoder, the initialization is first executed through writing 1200 (i.e., the column number of parity-check matrix for LDPC code) initial origin LLRs successively into RAM.

Figure 16:
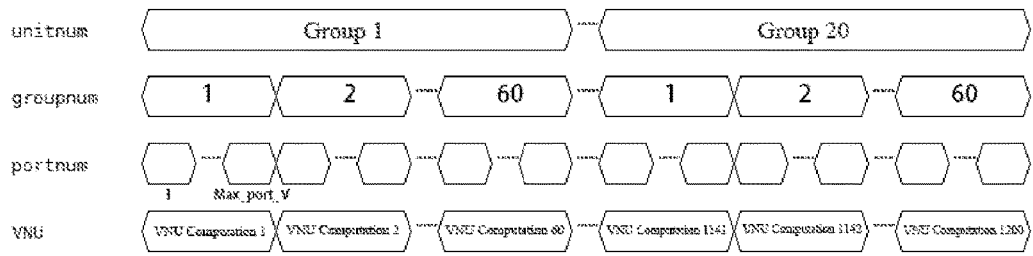
FIG. 16 illustrates a timing diagram for successively traversing computations of VNU.

For example, VNU may read a first initial LLR from the input buffer, and perform the hard-decision. The calculation unit may start the counting, and according to the state of counting, update the position in group groupnum. As can be appreciated, each update of the position in group groupnum may correspond to the writing operation of an initial LLR by VNU (or a computation operation by VNU during the iteration), and the controller may increase the port number portnum, from "1" to the corresponding Max_port_V during the process of writing of an initial LLR (or a computation operation by VNU). The initial LLR is to be written into all ports to which each group position unitnum and position in group groupnum corresponds. The addressing unit may find the corresponding address according to the group position unitnum and port number portnum as well as the first mapping relationship as stored. A writing address of VNU may be obtained by a combination of the address indicated by the addressing unit and the position in group groupnum indicated by the calculation unit. VNU may write the first hard-decision and initial LLR into the corresponding writing address of RAM. Subsequently, VNU may, in the initialization, write into RAM successively according to the initial LLR. The calculation unit may count the number of writing in the initialization, and according to the state of counting, may increase the position in group groupnum by 1 successively until 60 (equaling to the size of circulant matrix) and then return the same to zero, and increase the group position unitnum, by 1 successively until 20 (i.e., column number of base matrix). FIG. 16 illustrates a timing diagram for successively traversing computations by VNU. In one case the successively traversing computations include a number of computations performed in sequence with one computation beginning after the last computation has completed. As shown in FIG. 16, VNU will conduct 1200 computations.

During the initialization as described above, VNU may read initial LLRs successively from the input buffer, and perform the hard-decision according to the initial LLRs and store the hard-decision and LLRs to a corresponding storage unit in RAM. If all values in RAM are zero before the initialization, VNU may enable the initialization through an iteration of the traversing computations of variable nodes.

Further, VNU may be connected with the addressing unit, and read from or write into RAM according to the address indicated by the addressing unit; VNU may not be directly connected with the addressing unit but instead be connected with RAM, and the addressing unit is just used for generating the reading or writing address for RAM.

After the initialization, the check node computation may be performed. The input information useful for the check node computation may be serially read from RAM under the control of controller, and the result of computation may be stored in the corresponding position in RAM under the control of controller.

The calculation unit may count the number of computations processed by CNU, and according to the state of counting, may update the position in group groupnum. As can be appreciated, each update of the position in group groupnum, may correspond to one computation processed by CNU, and, during one computation processed by CNU, the controller may increase the port number portnum from "1" to the Max_port_C. Further, since the circulant matrix has an offset off_addr, the initial value of groupnum may be off_addr. In the process of counting, if the position in group groupnum is greater than 60, the groupnum will be updated as groupnum minus 60. When the counting by the calculation unit reaches 60, groupnum returns back to the initial value, and the group position unitnum is increased by 1. The above computation is performed iteratively until unitnum is increased to 10 (i.e., row number of base matrix). The group position unitnum and the port number portnum are output to the addressing unit by the calculation unit, and the addressing unit may find the corresponding address according to the check node-edge mapping relationship as stored. The reading or writing address of CNU may be obtained by a combination of the address indicated by the addressing unit and the position in group groupnum indicated by the calculation unit.

Figure 17:
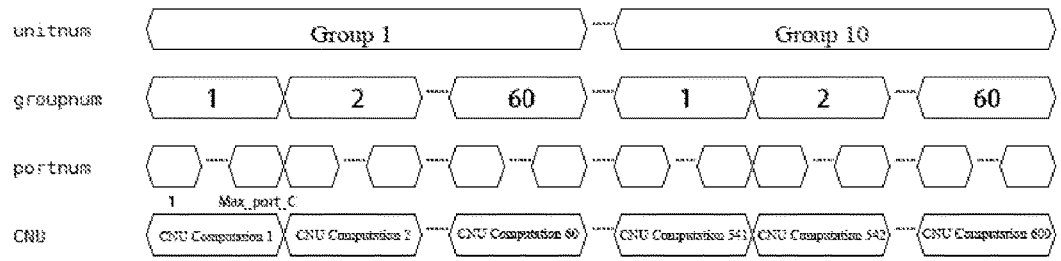
FIG. 17 illustrates the timing diagram for successively traversing computations of CNU.

For example, in the scenario of binary LDPC code, during the process of the CNU computation, CNU may, under control of the controller, read successively from RAM the LLRs and hard-decisions of the edges to which each control node corresponds (i.e. with the port number portnum from "1" to Max_port_C), and calculate the minimum and second minimum in a group of input LLRs of all edges to which each control node corresponds. The second minimum LLR will be written at the address corresponding to the minimum input LLR, and the minimum LLR will be written at other addresses. Subsequently, all other control nodes are involved in the computation in a traversing manner. FIG. 17 illustrates the timing diagram for successively traversing computation by CNU. As shown in the figure, CNU will perform 600 computations.

In the scenario of non-binary LDPC code, during the process of the CNU computation, CNU may, under the control of controller, read successively from RAM the iterative messages of the edges to which each control node corresponds (i.e. with the port number portnum from "1" to Max_port_C). The iterative message may include, for example, a message vector consisting of a plurality of codeword symbols and a plurality of corresponding confidences. For non-binary LDPC code, the computation for the input data among a plurality of ports of check node will be the multiple convolution sorting calculations. Specifically, a new vector message resulted from a convolution sorting calculation based on two iterative vector messages will, together with another iterative vector message, become a basis for a further convolution sorting calculation, and so on. In the circumstance that the row weight of base matrix is not fixed, a CNU in a serial architecture may be configured such that a computation by CNU with the port number not fixed could be enabled through allocating inside CNU cache spaces in the number of at least Max_port, wherein Max_port equals to the maximum in a group of Max_port_C to which all columns correspond.

For example, the number of Max_port+1 cache spaces can be allocated in CNU. When Max_port equals to 3, four cache spaces may be allocated in CNU. In particular, firstly, the iterative vector messages of three ports are serially read and then stored in three different cache spaces; and then a convolution sorting calculation is performed between the iterative messages input from the first port and the second port, and the result of calculation is stored in the fourth cache space. Then a convolution sorting calculation is performed between the iterative vector messages from the first port and the third port, and the result of calculation is stored in the first cache space. Finally a convolution sorting calculation is performed between the iterative messages from the second port and the third port, and the result of calculation is stored in the second cache space, and thus calculations based on all the iterative vector messages from all of ports are completed. Further, when Max_port equals to 4, five cache spaces may be allocated in CNU. In particular, for rows with the weight as 3 in the base matrix, the newly-added cache space is left idle and the calculation based on all the iterative vector messages from all of three ports is still performed in the sequence as described above; for rows with the weight as 4 in the base matrix, the iterative vector message from the fourth port is stored in the newly-added cache space, firstly, the calculation based on the iterative vector messages from the first three ports is performed in the sequence as described above, then a convolution sorting calculation is performed between the iterative vector message from the third port and the vector message in the first cache space resulted from the calculation based on the first port and the second port, and the result of calculation is stored in the third cache space, then respective convolution sorting calculation is performed between the iterative vector message from the fourth port and the respective iterative vector messages from the first, second, and fourth cache spaces, and respective results of calculation are stored back in the first, second, and fourth cache spaces, and thus calculations based on all the iterative vector messages output from all of four ports are completed. As such, whenever Max_port is increased by 1, any CNU calculations with the number of input port no more than Max_port could be completed by only adding a cache space in CNU.

In addition, if the input iterative vector messages are not stored in CNU but, when in use, read from the outside, then only Max_port cache spaces are required in CNU to store the intermediate vector messages and the output iterative vector messages.

As can be seen, according to the present embodiment, it is possible to realize the complicated CNU computation for non-binary LDPC code by allocating cache spaces in the number of Max_port or at most Max_port+1 in CNU of the decoder.

After the traversing computation of control nodes is completed, the controller may sum all the hard-decisions and judge if the checksum is zero. If the checksum is zero, the decoding ends; if the checksum is not zero, the iteration for the variable node computation will continue. The checksum is the sum of products of hard-decisions of edges to which the check node corresponds multiplied by non-zero elements at positions in the parity-check matrix corresponding to the edges. For the non-binary LDPC code, the value of non-zero element also needs to be recorded.

During the variable node computation, the manner for performing the computation for binary LDPC code is similar to that for non-binary LDPC code. Taking the binary LDPC code as an example, for each computation by VNU, VNU may read an initial LLR from an input cache and an LLR from the first port of RAM, add the initial LLR and the LLR from the first port together, and store inside VNU the LLR from the first port. Then, VNU read and accumulate LLRs from other ports successively so as to obtain LLR_total. In addition, VNU also stores inside the LLRs from other ports. A hard-decision is performed for LLR_total, and then said hard-decision and the difference between LLR_total and an input value from a port are output to the corresponding port and stored in RAM.

Subsequently, the iterations may continue for the update in connection of variable nodes and check nodes, until the decoding succeeds or the number of iterations reaches the maximum as preset.

As can be appreciated, if the storing sequence of RAM is in consistent with the traversing sequence of VNU, it is not necessary to use a mapping table for recording the mapping relationship in the addressing unit, and instead, the address for traversing computation of VNU may be obtained through the calculation or linkage based on unitnum, portnum and groupnum provided by the calculation unit. If the storing sequence of RAM is in consistent with the traversing sequence of CNU, it is not necessary to use a mapping table for recording the mapping relationship in the addressing unit, and instead, the addressing for traversing computation by CNU may be obtained through the calculation or linkage based on unitnum, portnum and groupnum provided by the calculation unit. As such, hardware resources can be further saved.

According to the embodiment of present application, the decoder for LDPC code comprises one variable node processing unit and one check node processing unit. However, as can be understood by those skilled in the art, the decoder for LDPC code may comprise a plurality of variable node processing units and a plurality of check node processing units, and in a similar manner, the controller may control the variable node processing units to compute variable node messages in a traversing manner for all variable nodes and may update the iterative messages in the memory according to the computed variable node messages, and may also control the check node processing units to compute check node messages in a traversing manner for all check nodes and may update the iterative messages in the memory according to the computed variable node messages.

Further, as described above, all variable node messages are computed in a traversing manner by one variable node processing unit and all check node messages are computed in a traversing manner by one check node processing unit so as to enable the iterative decoding by the LPDC encoder. In addition, according to another embodiment of the present application, the decoder may comprise only one node processing unit for computing all variable node messages and all check node messages in a traversing manner so as to enable the iterative encoding in a layered configuration.

Figure 18:
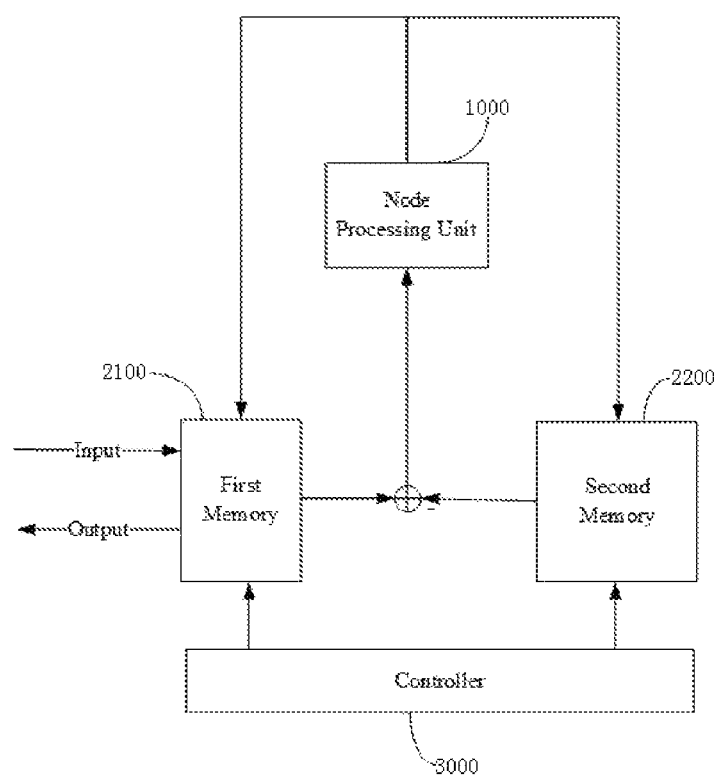
FIG. 18 illustrates a block diagram of decoder for LDPC code, according to an embodiment of the present application.

The layered-decoding of the LPDC decoder can be implemented in a serial manner similar to that of the embodiments as described above. FIG. 18 illustrates a block diagram of decoder for LDPC code, according to an embodiment of the present application. As shown in FIG. 18, the decoder for LDPC code may include a node processing unit 1000, a first memory 2100, a second memory 2200, and a controller 3000.

The first memory 2100 may store iterative messages of variable nodes of a parity-check matrix for LDPC code. For example, the first memory 2100 may store a total confidence LLR_total for all variable nodes of parity-check matrix for LDPC code. The second memory 2200 may store iterative messages of edges of the parity-check matrix for LDPC code. For example, the second memory 2200 may store the codeword symbols and confidences for all edges of parity-check matrix for LDPC code. The controller 3000 may control the node processing unit to perform iterations of decoding until the decoding ends. In each iteration of decoding, the controller controls the node processing unit to compute, in a traversing manner, variable node messages of all variable nodes and check node messages of all check nodes, following a sequence of check nodes, and updates respective iterative messages in the first memory and in the second memory according to the variable node messages and the check node messages.

The controller 3000 may further include an addressing unit 3100 and a calculation unit 3200. The addressing unit 3100 may store a first mapping relationship between variable nodes and check nodes, and also store a second mapping relationship between a traversing sequence of the node processing unit for all check nodes and a storing sequence of the memory for all edges of the parity-check matrix. The calculation unit 3200 may count the number of computations of the node processing unit 1000, according to the state of counting, control the addressing unit to indicate the address corresponding to the current computation in the storage unit, and control the node processing unit to, according to the address as indicated, update the first memory and the second memory through a total confidence for variable nodes to which the check node involved in the current computation corresponds and codeword symbols and confidences for edges to which the check node involved in the current computation corresponds.

In the circumstance that the LDPC code contains a plurality of circulant matrices, the addressing unit 310 may only store one mapping address for the communication between the node processing unit and the first memory and one mapping address for the communication between the node processing unit and the second memory, and therefore hardware resources are further saved and the cost is further reduced. For each circulant matrix, iterative messages of edges in said each circulant matrix may be stored in sequence in the memory. In the addressing unit 3100, only a first mapping address of a variable node in the memory to which any check node in said each circulant matrix corresponds and only a second mapping address of an edge in the memory to which any check node in said each circulant matrix corresponds are stored. Mapping addresses of edges in the first memory to which other check nodes in said each circulant matrix correspond may be determined according to the first mapping address, positions of said other check nodes relative to said any check node and/or an offset of said each circulant matrix; and mapping addresses of edges in the second memory to which other variable nodes in said each circulant correspond may be determined according to the second mapping address, positions of said other variable nodes relative to said any variable node and/or an offset of said each circulant matrix.

Embodiments of the present application may be implemented by hardware, software or the combination thereof. An aspect of the present application provides a program including executable instructions to implement an encoder and decoder for LDPC code according to embodiments of the present application. In addition, the program can be stored in storage of any form, such as optical or magnetic readable media, chip, ROM, PROM, or any form of volatile or non-volatile memory device. According to an example of the embodiment of the present application, a machine-readable storage is provided for storing the program.

While various embodiments of the present application have been described above referring to the drawings, it should be understood that they have been presented by way of example only, and not limitation. It will be apparent to those skilled in the art that various changes in form and detail can be made therein without departing from the spirit and scope of the invention.

What is claimed is:

1. A decoder for LDPC code, comprising:
a single variable node processing unit;
a single check node processing unit;
a memory for storing iterative messages of edges of a parity-check matrix for an LDPC code; and
a controller for controlling the variable node processing unit and the check node processing unit to perform iterations of decoding until the decoding ends, wherein, in each iteration of decoding, the controller controls the variable node processing unit to sequentially compute variable node messages in a traversing manner for all variable nodes and updates the iterative messages in the memory consistent with the computed variable node messages, and controls the check node processing unit to sequentially compute check node messages in a traversing manner for all check nodes and updates the iterative messages in the memory consistent with the computed check node messages, and wherein the controller further comprises an addressing unit for storing a first mapping relationship between a traversing sequence of the variable node processing unit for all variable nodes and a storing sequence of the memory for the iterative messages of edges of the parity-check matrix, and for storing a second mapping relationship between a traversing sequence of the check node processing unit for all check nodes and a storing sequence of the memory for the iterative messages of edges of the parity-check matrix.

2. The decoder for LDPC code as claimed in claim 1, wherein the controller further comprises a calculation unit, wherein,
the calculation unit counts the number of traversing computations of the variable node processing unit so as to determine a state of current variable node computation, the variable node addressing unit determines a first current mapping address according to the state of current variable node computation and the first mapping relationship, and the variable node processing unit updates an iterative message in the memory according to the first current mapping address; and
the calculation unit counts the number of traversing computations of the check node processing unit so as to determine a state of current check node computation, the check node addressing unit determines a second current mapping address according to the state of current check node computation and the second mapping relationship, and the check node processing unit updates an iterative message in the memory according to the second current mapping address.

3. The decoder for LDPC code as claimed in claim 2, wherein the parity-check matrix for the LDPC code comprises a plurality of circulant matrices, and, for each circulant matrix,
the iterative messages of edges of the circulant matrix are stored in sequence in the memory, and only a first mapping address of an edge in the memory to which any variable node in the circulant matrix corresponds and only a second mapping address of an edge in the memory to which any check node in the circulant matrix corresponds are stored in the addressing unit.

4. The decoder for LDPC code as claimed in claim 3, wherein mapping addresses of edges in the memory to which other variable nodes in said each circulant matrix correspond are determined according to the first mapping address, positions of said other variable nodes relative to said any variable node and/or an offset of said each circulant matrix; and
mapping addresses of edges in the memory to which other check nodes in said each circulant matrix correspond are determined according to the second mapping address, positions of said other check nodes relative to said any check node and/or the offset of said each circulant matrix.

5. The decoder for LDPC code as claimed in claim 1, wherein an iterative message for an edge stored in the memory comprises a codeword symbol and confidence corresponding to the edge, a variable node message of a variable node comprises a codeword symbol and confidence of each edge to which said variable node corresponds, and a check node message of a check node comprises a codeword symbol and confidence of each edge to which said check node corresponds.

6. The decoder for LDPC code as claimed in claim 5, wherein the variable node processing unit, when performing a current variable node computation, obtains from the memory an iterative message of each edge to which a variable node involved in the current variable node computation corresponds, performs a computation based on the obtained iterative message along with an initial confidence of the variable node involved in the current variable node computation so as to obtain the codeword symbol and confidence of each edge to which the variable node involved in the current variable node computation corresponds, and updates a codeword symbol and confidence in the iterative messages in the memory for each edge to which the variable node involved in the current variable node computation corresponds.

7. The decoder for LDPC code as claimed in claim 5, wherein the check node processing unit, when performing a current check node computation, obtains from the memory an iterative message of each edge to which a check node involved in the current check node computation corresponds, performs a computation based on the obtained iterative message so as to obtain the codeword symbol and confidence of each edge to which the check node involved in the current check node computation corresponds, and updates a codeword symbol and confidence in the iterative message in the memory for each edge to which the check node involved in the current check node computation corresponds.

8. The decoder for LDPC code as claimed in claim 7, wherein, for a non-binary LDPC code, the check node processing unit comprises a plurality of cache spaces for storing an intermediate result for check node computation, wherein the number of the cache spaces is determined according to the maximum number of column to which all rows of circulant matrices in a base matrix of the parity-check matrix corresponds.

9. The decoder for LDPC code as claimed in claim 1, wherein, after one iteration of decoding ends, the controller determines whether checksums for all check nodes are each zero, and
if the checksums are each zero, the decoding succeeds; and if not, the controller controls the performance of a next iteration of decoding; and if the number of iterations reaches the maximum, the decoding fails.

10. The decoder for LDPC code as claimed in claim 1, wherein the single variable node processing unit is a first variable node processing unit, wherein the single check node processing unit is a first check node processing unit, wherein the traversing manner is a first traversing manner, the decoder further comprising:
a second variable node processing unit;
a second check node processing unit; and
wherein the controller is further operable to control the second variable node processing unit and the second check node processing unit to perform the iterations of decoding until the decoding ends, wherein, in each iteration of decoding, the controller controls the second variable node processing unit to sequentially compute variable node messages in a second traversing manner for all variable nodes and updates the iterative messages in the memory according to the computed variable node messages, and controls the check node processing units to sequentially compute check node messages in a second traversing manner for all check nodes and updates the iterative messages in the memory according to the computed check node messages.

11. The decoder for LDPC code as claimed in claim 1, wherein the LDPC code includes both binary LDPC code and non-binary LDPC code.

12. A decoder for LDPC code, comprising:
a single node processing unit;
a first memory for storing iterative messages of variable nodes of a parity-check matrix for an LDPC code, wherein at least one of the iterative messages stored in the first memory comprises a total confidence of variable nodes, and an iterative message stored in the second memory comprises a codeword symbol and confidence of an edge of parity-check matrix;
a second memory for storing iterative messages of edges of the parity-check matrix for the LDPC code; and
a controller for controlling the node processing unit to perform iterations of decoding until the decoding ends, wherein, in each iteration of decoding, the controller controls the node processing unit to sequentially compute, in a traversing manner, variable node messages for all variable nodes and to sequentially compute check node messages for all check nodes, following a sequence of check nodes, and updates respective iterative messages in the first memory and in the second memory consistent with the variable node messages and the check node messages.

13. The decoder for LDPC code as claimed in claim 12, wherein the controller comprises:
an addressing unit for storing a first mapping relationship between check nodes and variable nodes, and for storing a second mapping relationship between a traversing sequence of the check node processing unit for all check nodes and a storing sequence of the memory for edges of the parity-check matrix; and
a calculation unit for counting the number of traversing computations of the node processing unit, controlling the addressing unit to indicate an address of memory corresponding to the current computation according to the state of counting, and controlling the node processing unit to, according to the address as indicated, update the first memory and the second memory through the total confidence for each variable node to which a check node involved in the current computation correspond and the codeword symbol and confidence for each edge to which a check node involved in the current computation corresponds.

14. The decoder for LDPC code as claimed in claim 12, wherein the parity-check matrix for LDPC code comprises a plurality of circulant matrices, and, for each circulant matrix,
only a first mapping address of a variable node in the memory to which any variable node in said each circulant matrix corresponds and only a second mapping address of an edge in the memory to which any check node in said each circulant matrix corresponds are stored in the addressing unit.

15. The decoder for LDPC code as claimed in claim 14, wherein mapping addresses of edges in the first memory to which other check nodes in said each circulant matrix corresponds are determined according to the first mapping address, positions of said other check nodes relative to said any check node and/or an offset of said each circulant matrix; and mapping addresses of edges in the second memory to which other variable nodes in said each circulant matrix corresponds are determined according to the second mapping address, positions of said other variable nodes relative to said any variable node and/or an offset of said each circulant matrix.

16. The decoding method of claim 12, wherein the LDPC code includes both binary LDPC code and non-binary LDPC code.

17. A decoding method for LDPC code, comprising:
storing iterative messages of edges of a parity-check matrix for LDPC code to a memory;
performing iterations of decoding until the decoding ends, wherein, in each iteration of decoding:
successively computing variable node messages in a traversing manner for all variable nodes, and updating the iterative messages as stored accordingly; and
successively computing check node messages in a traversing manner for all check nodes and updating the iterative messages as stored accordingly; and
storing a first mapping relationship and a second mapping relationship to the memory, wherein the first mapping relationship comprises a mapping relationship between a traversing sequence of successive variable node computations for all variable nodes and a storing sequence for the iterative messages of edges of the parity-check matrix as stored, and the second mapping relationship comprises a mapping relationship between a traversing sequence of successive check node computations for all check nodes and a storing sequence for the iterative messages of edges of the parity-check matrix as stored.

18. The decoding method for LDPC code as claimed in claim 17, wherein,
counting the number of traversing computations of the variable node processing unit so as to determine a state of current variable node computation, determining a first current mapping address according to the state of current variable node computation, and updating an iterative message as stored according to the first current mapping address; and
counting the number of traversing computations of the check node processing unit so as to determine a state of current check node computation, determining a second current mapping address according to the state of current check node computation, and updating an iterative message as stored according to the second current mapping address.

19. The decoding method for LDPC code as claimed in claim 18, wherein the parity-check matrix for LDPC code comprises a plurality of circulant matrices, and, for each circulant matrix, the first mapping address comprises only a first mapping address of an iterative message for an edge as stored to which any variable node in said each circulant matrix corresponds, and the second mapping address comprises only a first mapping address of an iterative message for an edge as stored to which any check node in said each circulant matrix corresponds.

20. The decoding method for LDPC code as claimed in claim 19, wherein, mapping addresses of iterative messages of edges as stored to which other variable nodes in said each circulant matrix correspond are determined according to the first mapping address, positions of said other variable nodes relative to said any variable node and/or an offset of said each circulant matrix; and mapping addresses of iterative messages of edges as stored to which other check nodes in said each circulant matrix correspond are determined according to the second mapping address, positions of said other check nodes relative to said any check node and/or an offset of said each circulant matrix.

21. The decoding method for LDPC code as claimed in claim 17, wherein an iterative message for an edge as stored comprises a codeword symbol and confidence corresponding to the edge, a variable node message of a variable node comprises a codeword symbol and confidence of each edge to which said variable node corresponds, and a check node message of a check node comprises a codeword symbol and confidence of each edge to which said check node corresponds.

22. The decoding method for LDPC code as claimed in claim 21, wherein, when performing a current variable node computation, successively obtaining an iterative message as stored for each edge to which a variable node involved in the current variable node computation corresponds, and performing a computation based on the obtained iterative message along with an initial confidence of the variable node involved in the current variable node computation so as to obtain a codeword symbol and confidence of each edge to which the variable node involved in the current variable node computation corresponds, and updating a codeword symbol and confidence in the iterative message as stored for each edge to which the variable node involved in the current variable node computation corresponds.

23. The decoding method for LDPC code as claimed in claim 22, wherein, when performing a current check node computation, successively obtaining an iterative message as stored for each edge to which a check node involved in the current check node computation corresponds, and performing a computation based on the obtained iterative message so as to obtain a codeword symbol and confidence of each edge to which the check node involved in the current check node computation corresponds, and updating a codeword symbol and confidence in the iterative message as stored for each edge to which the check node involved in the current check node computation corresponds.

24. The decoding method for LDPC code as claimed in claim 17, wherein, after one iteration of decoding ends, determining whether checksums for all check nodes are each zero, and if all checksums are each zero, the decoding succeeds; and
if not, performing a next iteration of decoding; and if the number of iterations reaches the maximum, the decoding fails.

25. The decoding method of claim 17, wherein the LDPC code includes both binary LDPC code and non-binary LDPC code.

* * * * *

UNITED STATES PATENT AND TRADEMARK OFFICE
CERTIFICATE OF CORRECTION

PATENT NO. : 10,536,169 B2
APPLICATION NO. : 15/529620
DATED : January 14, 2020
INVENTOR(S) : Huang et al.

Page 1 of 1

It is certified that error appears in the above-identified patent and that said Letters Patent is hereby corrected as shown below:

The Assignee should read:
1. Beihang University
2. Institute of Spacecraft System Engineering of China Academy of Space Technology; and
3. Beijing Hang Tian Hua Technology Co. LTD.

Signed and Sealed this
Third Day of November, 2020

Andrei Iancu
*Director of the United States Patent and Trademark Office*